United States Patent
Ueda et al.

(10) Patent No.: US 6,524,890 B2
(45) Date of Patent: Feb. 25, 2003

(54) METHOD FOR MANUFACTURING SEMICONDUCTOR DEVICE HAVING ELEMENT ISOLATION STRUCTURE

(75) Inventors: Nobumasa Ueda, Nagoya (JP); Shoji Mizuno, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/987,798

(22) Filed: Nov. 16, 2001

(65) Prior Publication Data

US 2002/0031897 A1 Mar. 14, 2002

Related U.S. Application Data

(63) Continuation-in-part of application No. 09/708,046, filed on Nov. 8, 2000.

(30) Foreign Application Priority Data

Nov. 17, 1999 (JP) .............................................. 11-326930

(51) Int. Cl.⁷ .......................... H01L 21/44; H01L 21/46
(52) U.S. Cl. ........................ 438/113; 438/406; 438/424; 438/459
(58) Field of Search ................................ 438/113, 406, 438/424, 458, 459

(56) References Cited

U.S. PATENT DOCUMENTS

| | | | |
|---|---|---|---|
| 3,457,123 A | 7/1969 | Pul ............................ | 438/459 |
| 4,501,060 A | 2/1985 | Frye et al. ................... | 438/459 |
| 4,784,970 A | 11/1988 | Solomon ..................... | 438/458 |
| 4,839,309 A | 6/1989 | Easter et al. | |
| 5,091,330 A | 2/1992 | Cambou et al. ............. | 438/406 |
| 5,204,282 A | 4/1993 | Tsuruta et al. .............. | 438/406 |
| 5,449,946 A | 9/1995 | Sakakibara et al. | |
| 5,459,104 A | 10/1995 | Sakai .......................... | 438/406 |
| 5,502,289 A | 3/1996 | Takiar ......................... | 257/666 |
| 5,773,352 A | 6/1998 | Hamajima .................. | 438/406 |
| 6,177,359 B1 | 1/2001 | Chen et al. ................. | 438/458 |
| 6,225,191 B1 | 5/2001 | Ahlquist et al. ............ | 438/459 |

FOREIGN PATENT DOCUMENTS

| | | |
|---|---|---|
| JP | A-59-186345 | 10/1984 |
| JP | A-63-302552 | 12/1988 |
| JP | A-9-8126 | 1/1997 |
| JP | A-11-307488 | 11/1999 |
| JP | A-2000-195825 | 7/2000 |
| JP | A-2001-144173 | 5/2001 |

OTHER PUBLICATIONS

Stanley Wolf, *Silicon Processing for the VLSI ERA*, vol. 2: Process Integration, Lattice Press, pp. 69–71, 1990.
Yamazaki and Aoyama, "Analysis in Function of Polishing Pad Grooves in CMP Apparatus," Jul. 19, 1999.

*Primary Examiner*—Carl Whitehead, Jr.
*Assistant Examiner*—David S Blum
(74) *Attorney, Agent, or Firm*—Law Offices of David G. Posz

(57) ABSTRACT

When a semiconductor device having an element isolation structure is formed, first, a trench is formed in a wafer from a principal surface of the wafer, and the trench is filled with an insulating film. Then, the back surface of the wafer is polished so that the insulating film is exposed on the back surface. Accordingly, the insulating film penetrates the wafer from the principal surface to the back surface, thereby performing element isolation of the wafer. It is not necessary to use a bonding wafer. Thus, the method for manufacturing the semiconductor device is simplified.

9 Claims, 4 Drawing Sheets

METHOD FOR MANUFACTURING SEMICONDUCTOR DEVICE HAVING ELEMENT ISOLATION STRUCTURE

CROSS REFERENCE TO RELATED APPLICATION

This application is a Continuation-in-part Application of U.S. application Ser. No. 09/708,046, filed on Nov. 8, 2000. The present invention is based upon and claims the benefit of Japanese Patent Application No. 11-326930 filed on Nov. 17, 1999, the contents of which are incorporated herein by reference.

BACKGROUND OF THE INVENTION

1. Field of the Invention

This invention relates to a method for manufacturing a semiconductor device adopting an element isolation structure.

2. Description of the Related Art

An SOI (Silicon On Insulator) structure is conventionally known as an element isolation structure. FIGS. 4A to 4F show a process for manufacturing a semiconductor device in which element isolation is achieved by an SOI structure, and the method for manufacturing this semiconductor device is explained below.

First, as shown in FIG. 4A, oxide films 13a, 13b are respectively formed, by surface oxidation, on a support wafer 11 and a wafer 12 for element formation (element formation wafer) each of which is composed of a silicon wafer. After that, the surfaces of the oxide films 13a, 13b are bonded together, and accordingly, an SOI substrate shown in FIG. 4B is formed, in which the support wafer 11 and the element formation wafer 12 are bonded together with an oxide film 13 interposed between them.

Successively, as shown in FIG. 4C, the element formation wafer 12 is mechanically polished until the thickness of the element formation wafer 12 falls in a range of several $\mu$m to about 20 $\mu$m, and mirror finishing is performed. Then, as shown in FIG. 4D, trenches 14 are formed such that the trenches 14 extend from the surface of the element formation wafer 12 to the oxide film 13. Element isolation is performed by filling the trenches 14 with an oxide film or poly silicon.

After that, elements (not shown) are formed in respective regions that are isolated from one another, and as shown in FIG. 4E, the SOI substrate is divided into chips. Then, as shown in FIG. 4F, for example, a chip is die-mounted on a substrate 17 such as a metallic plate through conductive paste 16. Thus, a semiconductor device that has isolated elements due to the SOI structure is finished. In this constitution, however, because the bonding wafer having the support wafer 11 is necessitated, the cost is high because of the number of processes required.

SUMMARY OF THE INVENTION

The present invention has been made in view of the above problems. An object of the present invention is to simplify a method for manufacturing a semiconductor device having an element isolation structure.

According to the present invention, briefly, after a trench is formed in a wafer from a principal surface of the wafer, the trench is filled with an insulating film. Then, the thickness of the wafer is thinned from a back surface of the wafer so that the insulating film is exposed on the back surface. Accordingly, element isolation of the wafer can be achieved by the insulating film penetrating the wafer from the principal surface to the back surface. It is not necessary to use a bonding wafer. As a result, the method for manufacturing the semiconductor device can be simplified.

BRIEF DESCRIPTION OF THE DRAWINGS

Other objects and features of the present invention will become more readily apparent from a better understanding of the preferred embodiment described below with reference to the following drawings, in which.

DETAILED DESCRIPTION OF THE PREFERRED EMBODIMENT

A method for manufacturing a semiconductor device adopting an element isolation structure according to the preferred embodiment is explained with reference to FIGS. 1A to 1E.

Figure 1A:
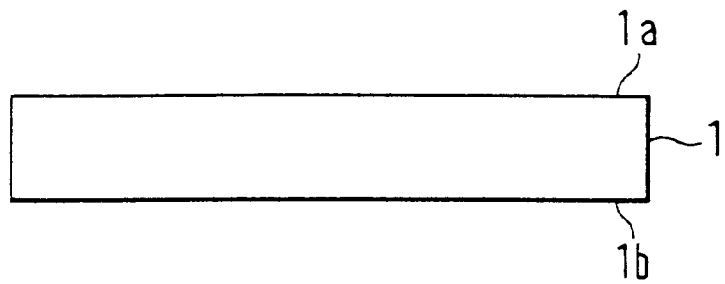
FIGS. 1A to 1E are cross-sectional views showing a process for manufacturing a semiconductor device adopting an element isolation structure according to a preferred embodiment of the present invention.
Figure 1B:
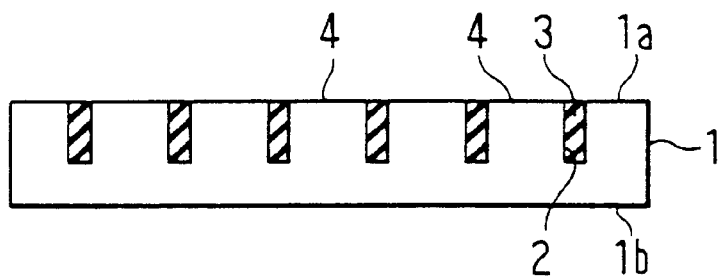

First, as shown in FIG. 1A, an element formation wafer 1 composed of a silicon substrate is prepared. For example, the wafer 1 may be an epi-wafer in which an $n^+$ type embedded layer and an $n^-$ type epitaxial growth layer are provided on a $p^-$ type substrate, but it should be appropriately selected in accordance with a semiconductor element that is formed. Then, as shown in FIG. 1B, trenches 2 are formed in the wafer 1 from a principal surface 1a of the wafer 1 at a specific depth (for example, several $\mu$m to about 20 $\mu$m), and the insides of the trenches 2 are filled with an insulating film 3 such as an oxide film or polysilicon. Accordingly, two adjacent of several element formation regions 4 of the wafer 1 are isolated by the insulating film 3 provided between them. Successively, although it is not shown, desired elements are formed in the respective element formation regions 4, which are isolated from one another, and a wiring layer, a surface protective film, and the like are formed.

Figure 1C:
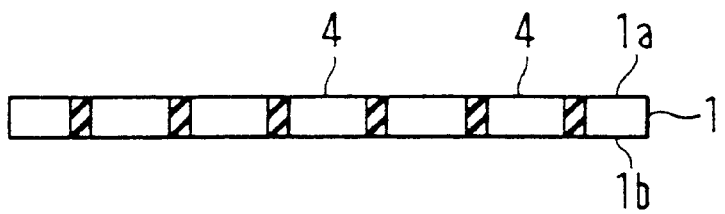
Figure 1D:
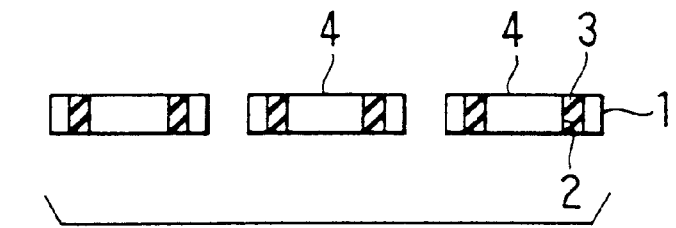
Figure 1E:
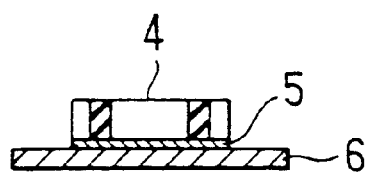

Next, as shown in FIG. 1C, the other surface (back surface) 1b of the wafer 1 is polished by a CMP (Chemical Mechanical Polish) until the insulating film 3 is exposed. For example, when the depth of the trenches is 20 $\mu$m, the wafer 1 is thinned so that its thickness becomes about 15 $\mu$m. After that, as shown in FIG. 1D, the wafer 1 is divided into chips by dicing. Then, as shown in FIG. 1E, each chip is die-mounted on a mounting board 6 such as a metallic plate through insulating paste (insulating adhesive) 5. Thus, the semiconductor device adopting an element isolation structure is completed.

According to the method described above, a bonding wafer that is used in a conventional SOI structure is not necessitated. The element isolation structure can be provided by performing the element formation step to the one wafer 1. Because of this, the element isolation structure can be simplified, and the manufacturing process of the semiconductor device to which the element isolation structure is adopted can be simplified simultaneously. As a result, cost reduction can be attained.

Also in the case of the conventional SOI structure, to take an electrical potential of a support wafer, the support wafer is die-mounted on a metallic plate or the like through conductive paste. To the contrary, in the case of the present embodiment, because such support wafer is not used and it is not necessary to take the electrical potential, the chip can be die-mounted by the insulating paste 5. This also contributes to cost reduction.

In the above-mentioned embodiment, although the back surface 1b is polished by the CMP method, it may be thinned by other methods such as etching. Besides in the above-mentioned embodiment, although the chip and the mounting board 6 are bonded together by the insulating adhesive 5 so that the insulating isolation at the chip back surface is provided, the insulating isolation may be attained by forming an insulating film such as an oxide film on the chip back surface. For example, in the step shown in FIG. 1C, after the back surface 1b of the wafer 1 is polished, an oxide film can be formed on the back surface by oxidizing the back surface of the wafer 1.

Next, more specific method for thinning a wafer will be described with reference to FIGS. 2A to 3B.

Figure 2A:
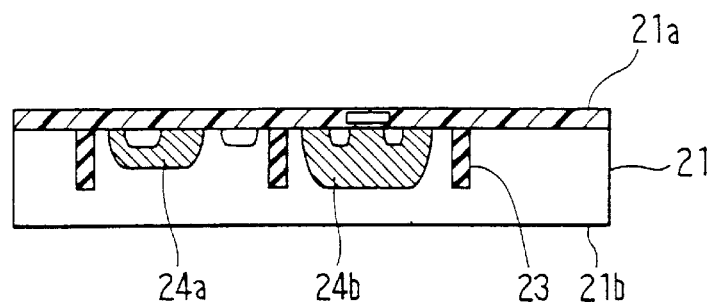
FIGS. 2A to 2E are cross-sectional views showing a process for manufacturing a semiconductor device adopting an element isolation structure according to a preferred embodiment of the present invention.

Similarly to the embodiment described above, an element formation wafer 21 composed of silicon substrate is prepared. This wafer also has a structure to form semiconductor elements such as a bi-polar transistor, a MOS transistor, or the like. In FIG. 2A, a bi-polar transistor 24a and a MOS transistor 24b are formed at a principal surface of the wafer. Wirings composed of polycrystalline silicon or aluminum, an interlayer oxide film, passivation film, or the like are formed on the principal surface of the wafer, although these are not shown in the drawings. Trenches 23 are formed in the wafer from the principal surface 21a. The trenches 23 do not reach a back surface 21b of the wafer 21. Moreover, the trenches 23 are formed deeper than a thickness of the wafer after polishing is performed, which is described in greater detail below.

Then, the wafer 21 is thinned to a predetermined thickness using a CMP (Chemical mechanical Polishing) apparatus. The predetermined thickness is thinner than a thickness corresponding to a depth of the trenches 23, for example, several $\mu$m to several ten $\mu$m.

Figure 2B:
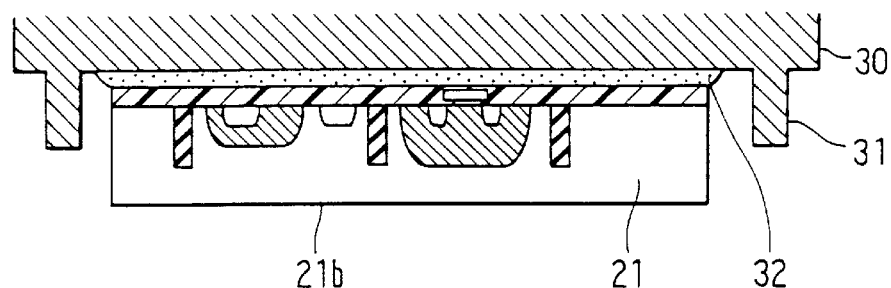
Figure 2C:
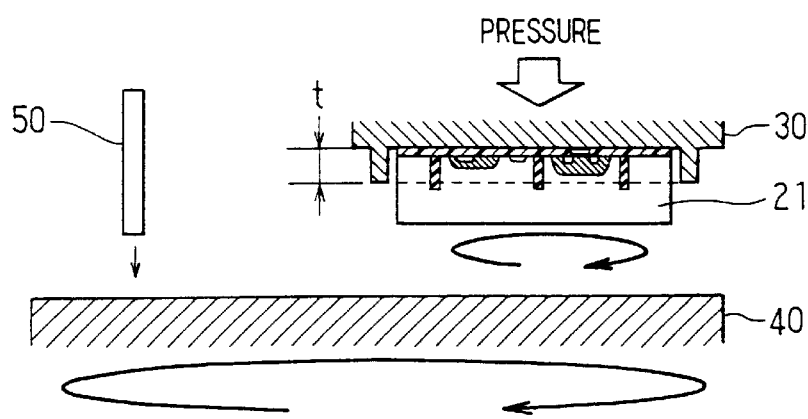
Figure 2D:
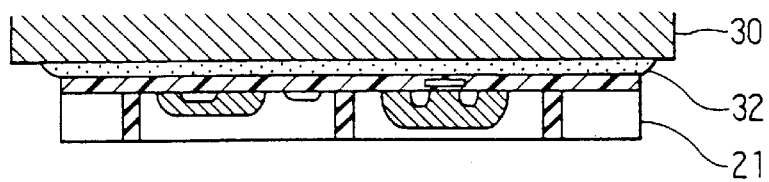
Figure 2E:
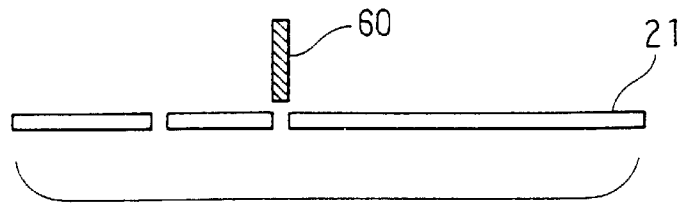

More specifically, as shown in FIG. 2B, the wafer 21 is fixed to a holder 30 with a wax 32 so that a side of the principal surface is attached to the holder 30. The holder 30 has a guide ring 31 to regulate a polishing thickness of the wafer 21. The guide ring 31 has a thickness t so as to control the thickness of the wafer that is to be left. The thickness t of the guide ring is in a range from several $\mu$m to several ten $\mu$m. Incidentally, when the guide ring is not formed in the holder 30, the thickness of the wafer may be measured optically, for example, by using a laser apparatus. That is, the thickness of the wafer is checked by measurement with the laser apparatus while the polishing of the wafer is performed.

The wafer attached to the holder 30 is pressed to a polishing stage (polishing pad) 40 and is rotated with respect to the polishing stage 40. Moreover, the polishing stage is also rotated. Slurry including abrasives is supplied on the polishing stage 40 by a dispenser 50 to polish the wafer.

When the guide ring 31 contacts the polishing stage 40, the polishing is finished. The guide ring 31 is composed of a hard metal such as Molybdenum. Therefore, the guide ring 31 is not polished so that the polishing is finished.

Then, an oxide film (not shown) is formed at the back surface of the wafer that is exposed after the polishing is finished, so that the MOS transistor 24b is insulated from the bi-polar transistor 24a with the trench 23 and the oxide film.

After that, the wafer is separated into chips by dicing with a dicing blade 60.

Finally, semiconductor devices without respective supporting substrates are formed through the above-mentioned process. The supporting wafer is unnecessary since the supporting substrates are unnecessary for the devices, so that cost for producing the semiconductor devices can be cut down.

Figure 3A:
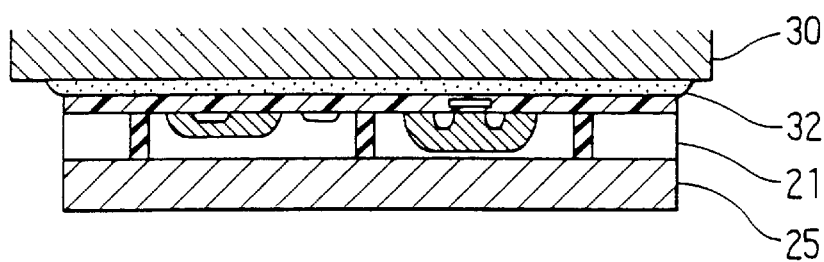
FIGS. 3A to 3B are cross-sectional views showing a part of process for manufacturing a semiconductor device adopting an element isolation structure according to a preferred embodiment of the present invention.
Figure 3B:
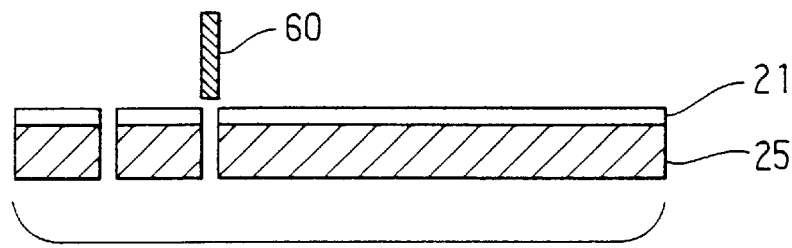
Figure 4A:
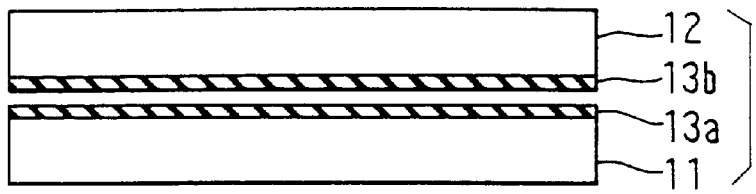
FIGS. 4A to 4F are cross-sectional views showing a process for manufacturing a semiconductor device adopting a conventional SOI structure.
Figure 4B:
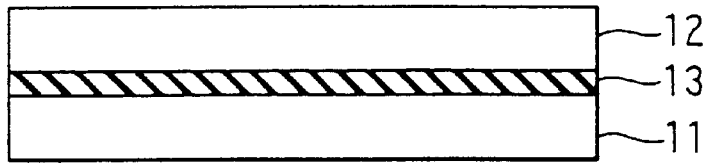
Figure 4C:
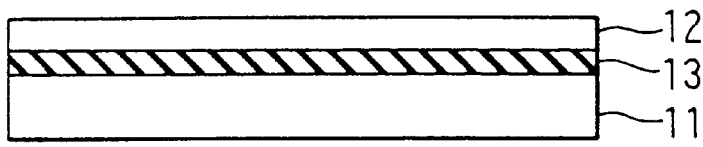
Figure 4D:
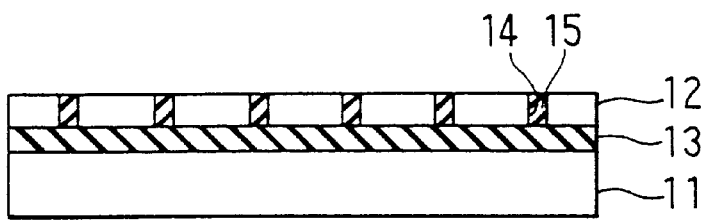
Figure 4E:
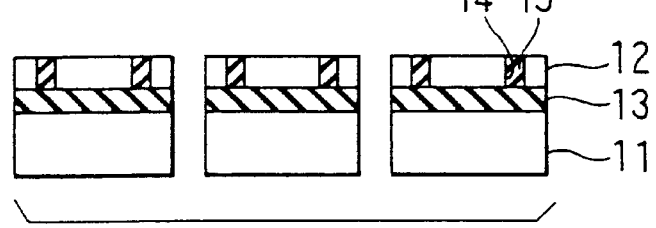
Figure 4F:
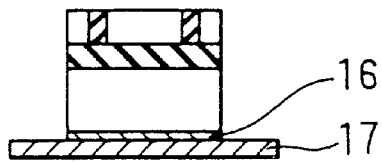

Incidentally, a problem may occur due to thinness of the wafer or the devices when the thinned wafer is handled or diced. In this case, a supporting substrate 25 can be attached to the back surface of the wafer with adhesive such as a paste including silver after the polishing is finished as shown in FIG. 3A. The supporting substrate may be composed of a metal such as copper. The thinned wafer 21 can be detached from the holder 30 and transferred with the supporting substrate. Moreover, the thinned wafer 21 is separated into chips with the supporting substrate by using the dicing blade 60 as shown in FIG. 3B. In this case, the supporting substrate 25 works as a heat sink or a pedestal.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A method for manufacturing a semiconductor device, comprising:

forming a trench in a wafer from a principal surface of the wafer for dividing the principal surface into first and second element formation regions;

filling the trench with an insulating layer;

forming first and second elements in the first and second element formation regions of the principal surface, respectively; and removing material from a back surface of the wafer after the forming first and second elements in the first and second element formation regions of the principal surface, for reducing a thickness of the wafer and for exposing the insulating layer from the back surface of the wafer, wherein the removing material from a back surface of the wafer is performed without attaching a supporting substrate to the wafer.

2. The method according to claim 1, further comprising:

dicing the wafer into a plurality of chips after the removing material from a back surface of the wafer; and mounting one of the plurality of chips on a mounting substrate.

3. The method according to claim 2, wherein the mounting one of the plurality of chips on a mounting substrate further comprises mounting the one of the plurality of chips on the mounting substrate through an insulating adhesive.

4. The method according to claim 1, further comprising forming a back surface insulating film on the back surface of the wafer after the removing material from a back surface of the wafer.

5. The method according to claim 1, wherein the removing material from a back surface of the wafer further comprises removing the material from the back surface of the wafer by chemical mechanical polishing.

6. The method according to claim 1, further comprising attaching a substrate to the back surface of the wafer after the removing material from a back surface of the wafer.

7. A method for manufacturing a semiconductor device, comprising:

forming a trench in a wafer from a principal surface of the wafer;

filling the trench with an insulating layer;

forming semiconductor elements in respective regions of the principal surface isolated from each other by the trench;

after the forming semiconductor elements in respective regions of the principal surface isolated from each other by the trench, removing material from a back surface of the wafer to reduce the thickness of the wafer without attaching a supporting substrate to the wafer for exposing the insulating layer from the back surface; and cutting the wafer at a location spaced from the trench for dividing the wafer into a plurality of chips.

8. The method according to claim 7, including, after the removing material from a back surface of the wafer, attaching a substrate to the back surface of the wafer.

9. The method of claim 1, wherein the forming first and second elements in the first and second element formation regions of the principal surface further comprises forming the first and second elements to have a depth that is less than a depth of the trench.

* * * * *